United States Patent
Shen et al.

(10) Patent No.: US 8,431,999 B2
(45) Date of Patent: Apr. 30, 2013

(54) LOW CAPACITANCE TRANSIENT VOLTAGE SUPPRESSOR

(75) Inventors: Yu-Shu Shen, Chiayi County (TW); Kun-Hsien Lin, Hsinchu (TW); Che-Hao Chuang, Hsinchu (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 271 days.

(21) Appl. No.: 13/072,138

(22) Filed: Mar. 25, 2011

(65) Prior Publication Data
US 2012/0241903 A1    Sep. 27, 2012

(51) Int. Cl.
*H01L 23/62* (2006.01)
*H01L 21/336* (2006.01)

(52) U.S. Cl.
USPC .......................................... 257/357; 438/268

(58) Field of Classification Search .................. 257/173, 257/328, 355–360, E21.004–E21.007; 438/212, 438/268
See application file for complete search history.

(56) References Cited

U.S. PATENT DOCUMENTS

| 7,538,395 B2 | 5/2009 | Keena et al. |
| 7,579,632 B2 * | 8/2009 | Salih et al. ..................... 257/173 |
| 7,880,223 B2 * | 2/2011 | Bobde ........................... 257/328 |

* cited by examiner

*Primary Examiner* — Calvin Lee
(74) *Attorney, Agent, or Firm* — Muncy, Geissler, Olds & Lowe, PLLC

(57) ABSTRACT

A low capacitance transient voltage suppressor is disclosed. The suppressor comprises an N-type heavily doped substrate and an epitaxial layer formed on the substrate. At least one steering diode structure formed in the epitaxial layer comprises a diode lightly doped well and a first P-type lightly doped well, wherein a P-type heavily doped area is formed in the diode lightly doped well and a first N-type heavily doped area and a second P-type heavily doped area are formed in the first P-type lightly doped well. A second P-type lightly doped well having two N-type heavily doped areas is formed in the epitaxial layer. In addition, an N-type heavily doped well and at least one deep isolation trench are formed in the epitaxial layer, wherein the trench has a depth greater than or equal to depths of all the doped wells, so as to separate at least one doped well.

13 Claims, 6 Drawing Sheets

LOW CAPACITANCE TRANSIENT VOLTAGE SUPPRESSOR

BACKGROUND OF THE INVENTION

1. Field of the Invention

The present invention relates to a transient voltage suppressor, particularly to a low capacitance transient voltage suppressor.

2. Description of the Related Art

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electrostatic Discharge) events. Currently, all consumer electronics are expected to pass the ESD test requirement of IEC 61000-4-2 standard. TVS (Transient Voltage Suppressor) is generally designed to bypass the ESD energy, so that the electronic systems can be prevented from ESD damages. The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices 10.

For high speed interface applications, such as Gigabit Ethernet, USB3.0 . . . , etc, the input capacitance of TVS should be designed as small as possible for better signal performance. However, the TVS device size should be designed large for better ESD performance which causes the large input capacitance. Therefore, how to reduce input capacitance of TVS device without reducing device size is a challenge.

The prior art provides the uni-directional TVS and the bi-directional TVS schematic circuits, which are depicted in FIG. 2 and FIG. 3 respectively. The structure of steering diodes 14 is widely used to reduce the input capacitance. The Zener diodes 16 shown in FIG. 2 and FIG. 3 could be replaced by NPN BJT (NPN bipolar junction transistor) or PNP BJT (PNP bipolar junction transistor) device to enhance the ESD performance. U.S. Pat. No. 7,880,223 is the prior art structure of bi-directional TVS with a vertical NPN BJT. The vertical NPN BJT is formed by the junction of N+ substrate (collector)/N-Epi/P-Body (base)/N+ (emitter). However, there are several drawbacks for this design. With the out-diffusion effect caused by the heavily doped substrate during the epitaxial process, the variation of the breakdown voltage ($V_{CEO}$) of the vertical NPN BJT is large. Such variation of the breakdown voltage will directly affect the trigger voltage of TVS. In addition, one of the steering diode is formed by the junction of N+/P-Body. To lower the breakdown voltage of vertical NPN BJT for low voltage application (for example $V_{BD}$=7.5V for 5V application), the doping concentration of P-Body should be high enough. With such high doping concentration of P-Body, the capacitance of diode with the junction of N+/P-Body can't be reduced. It's difficult to achieve the requirement of low capacitance of I/O pin with the prior art design.

To overcome the abovementioned problems, the present invention provides a low capacitance transient voltage suppressor, so as to solve the afore-mentioned problems of the prior art.

SUMMARY OF THE INVENTION

A primary objective of the present invention is to provide a transient voltage suppressor, which uses an N-type heavily doped well to provide a low resistance path, whereby the doping concentrations of P-type lightly doped wells achieve the requirements of low capacitance of I/O pin and low breakdown voltage of BJT structure at the same time.

To achieve the abovementioned objectives, the present invention provides a low capacitance transient voltage suppressor, which comprises an N-type heavily doped substrate and an epitaxial layer formed on the N-type heavily doped substrate. The epitaxial layer has at least one steering diode structure. The steering diode structure comprises a diode lightly doped well and a first P-type lightly doped well formed in the epitaxial layer, wherein a first P-type heavily doped area is formed in the diode lightly doped well, and a first N-type heavily doped area and a second P-type heavily doped area are formed in the first P-type lightly doped well. The first N-type heavily doped area is connected with the first P-type heavily doped area. The transient voltage suppressor further comprises a second P-type lightly doped well, and an N-type heavily doped well, and at least one deep isolation trench formed in the epitaxial layer. A second N-type heavily doped area and a third N-type heavily doped area are formed in the second P-type lightly doped well, and the second N-type heavily doped area is connected with the second P-type heavily doped area. The N-type heavily doped well is connected with the third N-type heavily doped area. The deep isolation trench has a depth greater than or equal to depths of all doped wells, and separating at least one doped well.

Below, the embodiments are described in detail in cooperation with the drawings to make easily understood the technical contents, characteristics and accomplishments of the present invention.

DETAILED DESCRIPTION OF THE INVENTION

Figure 1:
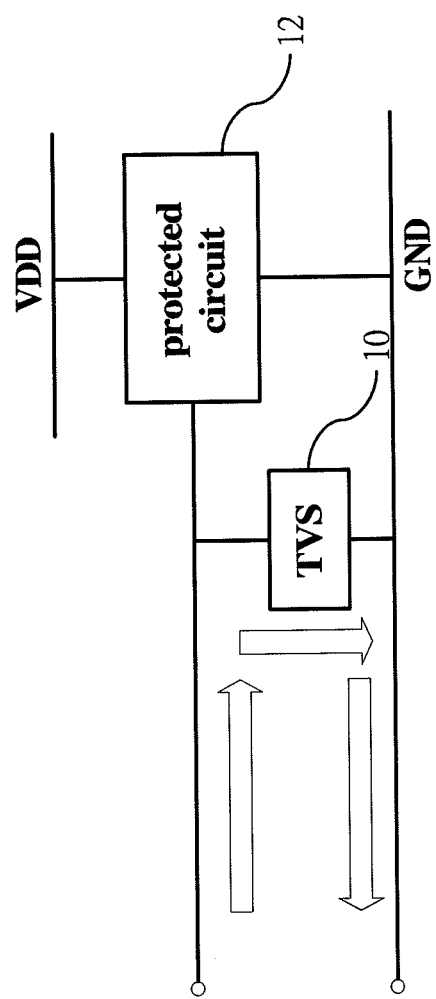
FIG. 1 is a circuit diagram showing a transient voltage suppressor connected with a protected circuit according to the prior art.
Figure 3:
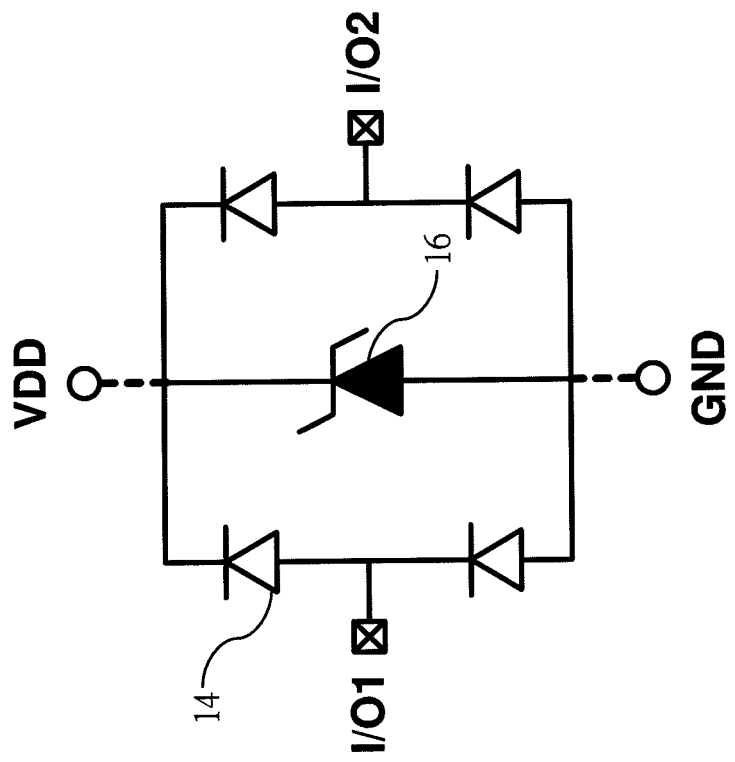
FIG. 3 is a circuit diagram showing the bi-directional transient voltage suppressor according to the prior art.
Figure 2:
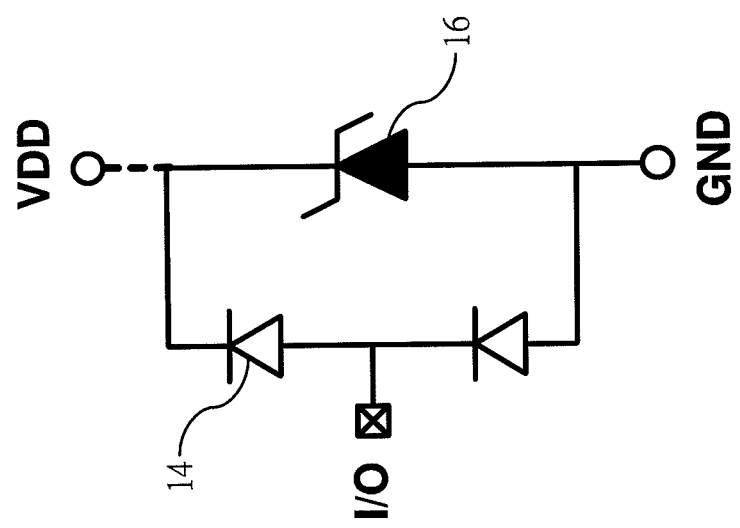
FIG. 2 is a circuit diagram showing the uni-directional transient voltage suppressor according to the prior art.
Figure 4:
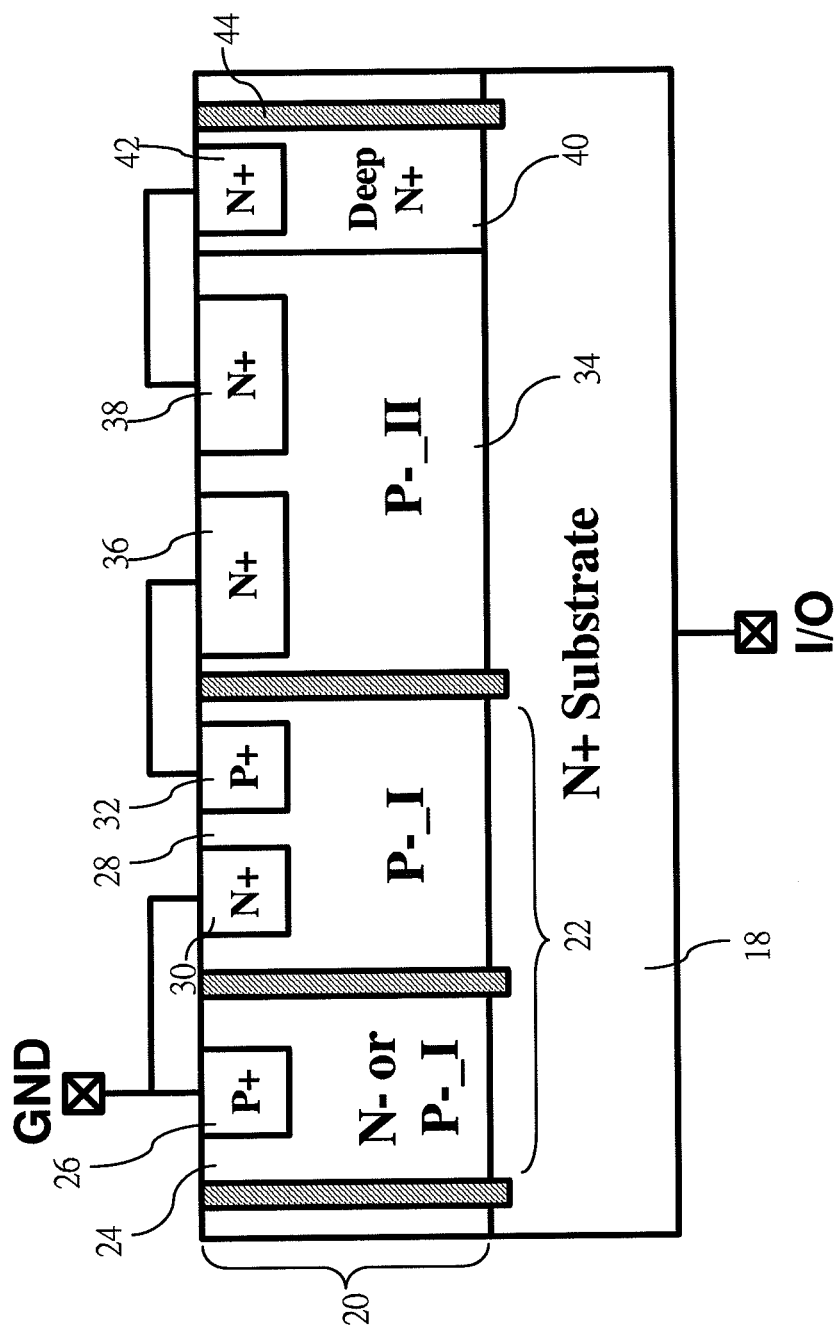
FIG. 4 is a sectional view schematically showing a transient voltage suppressor according to the first embodiment of the present invention.

Refer to FIG. 4. Below is described the first embodiment of the present invention. The transient voltage suppressor (TVS) of the present invention comprises an N-type heavily doped substrate 18 connected with an I/O pin and an epitaxial layer 20 formed on the N-type heavily doped substrate 18. And, at least one steering diode structure 22 is formed in the epitaxial layer 20. The number of the steering diode structure 22 is one, which is used as an example in the first embodiment. The steering diode structure 22 comprises a diode lightly doped well 24 and a first P-type lightly doped well 28 formed in the epitaxial layer 20, wherein the diode lightly doped well 24 is an N-type diode lightly doped well or a P-type diode lightly doped well. In addition, a first P-type heavily doped area 26 is formed in the diode lightly doped well 24, and a first N-type heavily doped area 30 and a second P-type heavily doped area 32 are formed in the first P-type lightly doped well 28. The first N-type heavily doped area 30 is connected with the first P-type heavily doped area 26, and the first P-type heavily doped area 26 and the first N-type heavily doped area 30 are jointly connected with a grounded pin GND. A vertical diode is formed by the first P-type heavily doped area 26, the diode lightly doped well 24, and the N-type heavily doped substrate 18. And a lateral diode is formed by the first N-type heavily doped area 30, the first P-type lightly doped well 28, and the second P-type heavily doped area 32.

The transient voltage suppressor further comprises a second P-type lightly doped well 34 formed in the epitaxial layer 20, wherein a second N-type heavily doped area 36 and a third N-type heavily doped area 38 are formed in the second P-type lightly doped well 34, and the second N-type heavily doped area 36 is connected with the second P-type heavily doped area 32. The second P-type lightly doped well 34 is further adjacent to an N-type heavily doped well 40 formed in the epitaxial layer 20. A fourth N-type heavily doped area 42 is not only formed in the N-type heavily doped well 40 but connects with the third N-type heavily doped area 38. A vertical BJT (bipolar junction transistor) is formed by the second N-type heavily doped area 36 (emitter), the second P-type lightly doped well 34 (base), and the N-type heavily doped substrate 18 (collector). And a lateral BJT is formed by the second N-type heavily doped area 36 (emitter), the second P-type lightly doped well 34 (base), and third N-type heavily doped area 38 (collector). The diode lightly doped well 24, the first P-type lightly doped well 28, the second P-type lightly doped well 34, the N-type heavily doped well 40, and at least one deep isolation trench 44 are horizontally formed in the epitaxial layer 20. The number of the deep isolation trench 44 is one, which is used as an example in the first embodiment. The deep isolation trench 44 has a depth greater than or equal to depths of all doped wells 24 and 28, 28 and 34, 34 and 40, so as to separate at least one doped well 24, 28, 34 and 40. To obtain the better isolation effect, the deep isolation trench 44 is located between the two neighboring doped wells 24 and 28, 28 and 34 to separate them in the first embodiment.

Figure 5:
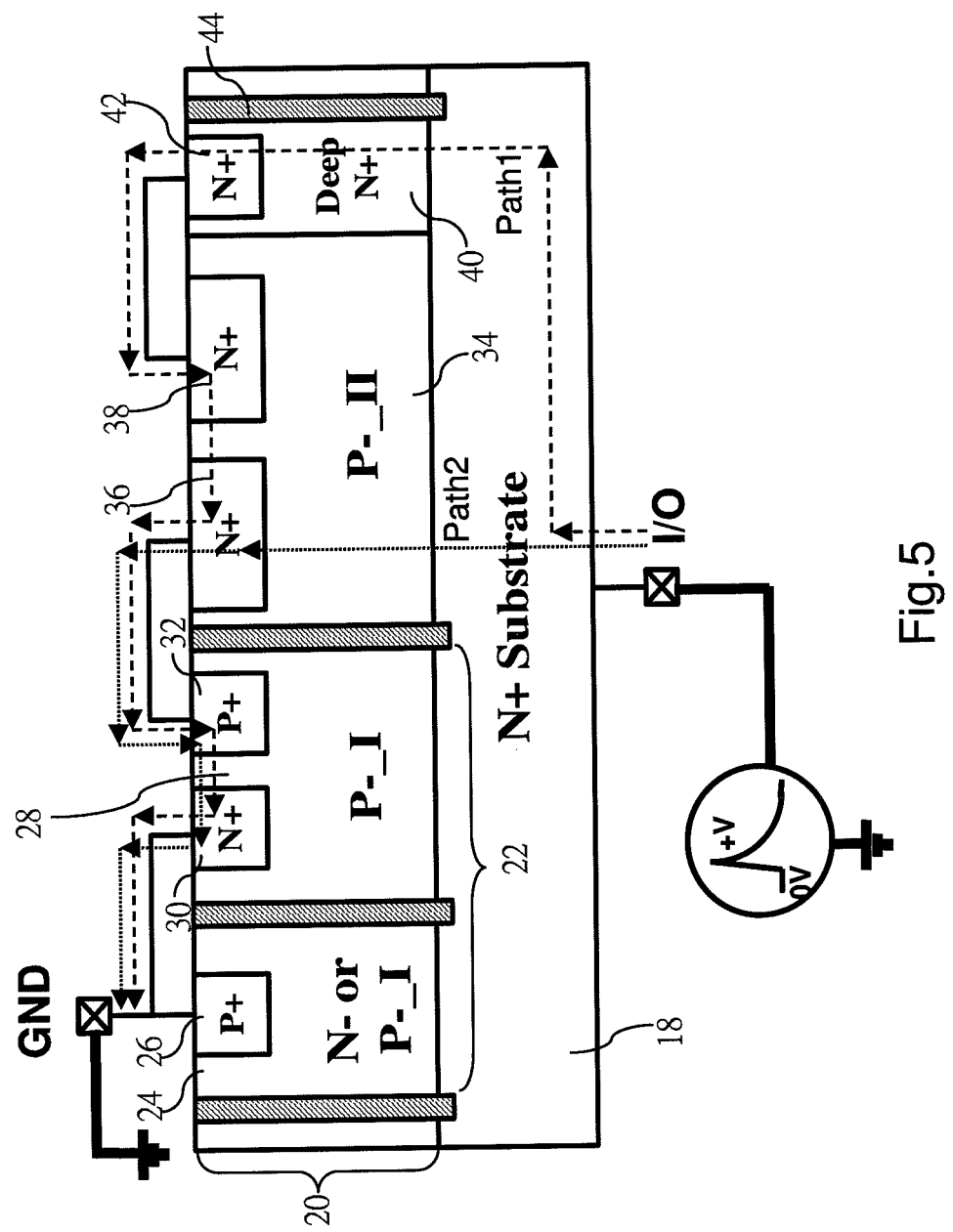
FIG. 5 is a sectional view schematically showing the transient voltage suppressor with ESD (Electrostatic Discharge) discharging paths according to the first embodiment of the present invention.

Refer to FIG. 4. With the fourth N-type heavily doped area 42 and the N-type heavily doped well 40, a low resistance path from the epitaxial surface to the N-type heavily doped substrate 18 is formed. As a result, the breakdown region occurs at the junction of the third N-type heavily doped area 38 and the second P-type lightly doped well 34. In other words, the breakdown voltage of lateral BJT can be easily adjusted to be smaller than that of vertical BJT. Therefore, the breakdown voltage of the present invention can be easily controlled as compared with that of prior art design. From FIG. 5, it is known that there are two ESD discharging paths in the first embodiment. For the I/O pin under positive ESD stress, the ESD current of path1 is discharged through the lateral BJT, and then discharged through the lateral diode to the grounded pin GND. The ESD current of path2 is discharged through the vertical BJT, and then discharged through the lateral diode to the grounded pin GND. With two ESD discharging paths in the present invention, the ESD protection efficiency of TVS can be improved within the limited layout area. For the I/O pin under negative ESD stress, the ESD current can be discharged through the vertical diode to the I/O pin. With this design of the present invention, the doping concentrations of first P-type lightly doped well 28 and the second P-type lightly doped well 34 can be controlled independently. The doping concentrations of first P-type lightly doped well 28 and the second P-type lightly doped well 34 can be different to achieve the requirements of low capacitance of I/O pin and low breakdown voltage of BJT structure at the same time. Besides, if the diode lightly doped well 24 is the P-type diode lightly doped well, the doping concentration of the diode lightly doped well 24 is different from that of the second P-type lightly doped well 34 as well.

Figure 6:
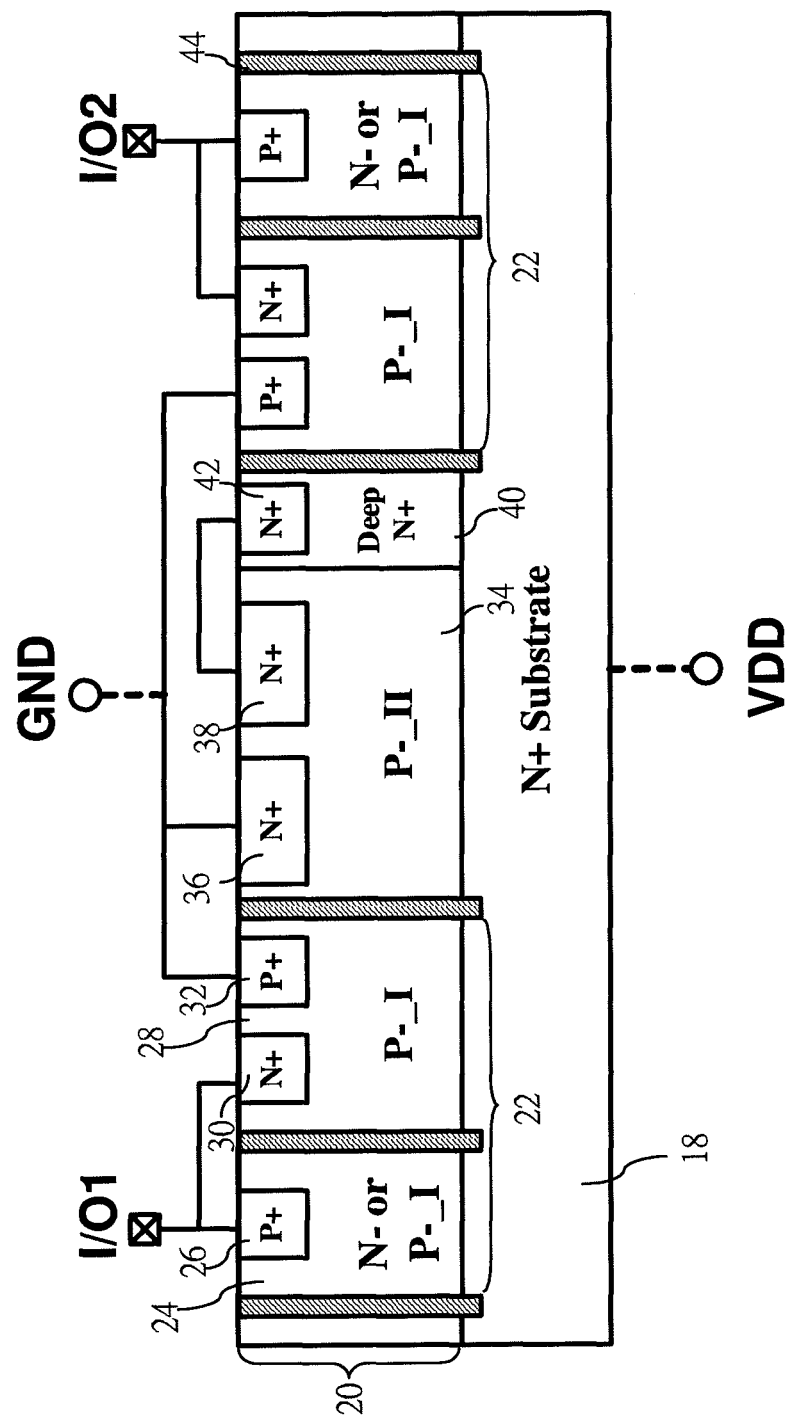
FIG. 6 is a sectional view schematically showing a transient voltage suppressor according to the second embodiment of the present invention.

The second embodiment is introduced as below. Refer to FIG. 6. The second embodiment is different from the first embodiment in the number of steering diode structure 22 and the connection positions of I/O pins and a grounded pin. The number of steering diode structure 22 is two in the second embodiment. The two steering diode structures 22 are horizontally formed in the epitaxial layer 20. Also, the deep isolation trench 44 is located between the two neighboring doped wells 24 and 28, 28 and 34, 34 and 40, to separate them. The first P-type heavily doped area 26 and the first N-type heavily doped area 30 of each steering diode structure 22 are connected with each other. In the second embodiment, one first P-type heavily doped area 26 and one first N-type heavily doped area 30 are connected with a first I/O pin I/O1, and another first P-type heavily doped area 26 and another first N-type heavily doped area 30 are connected with a second I/O pin I/O2. In addition, if necessary, the second P-type heavily doped areas 32 and the second N-type heavily doped area 36 are connected with a grounded pin GND, and the N-type heavily doped substrate 18 is connected with a high voltage pin VDD. In other words, the connection of the grounded pin and the high voltage pin is optional.

According to the above-mentioned, each steering diode structure 22 has a lateral diode and a vertical diode. For describing the operation of the second embodiment in detail, the lateral diode and the vertical diode in the left side are respectively viewed as a first lateral diode and a first vertical diode, and the lateral diode and the vertical diode in the right side are respectively viewed as a second lateral diode and a second vertical diode.

Figure 7:
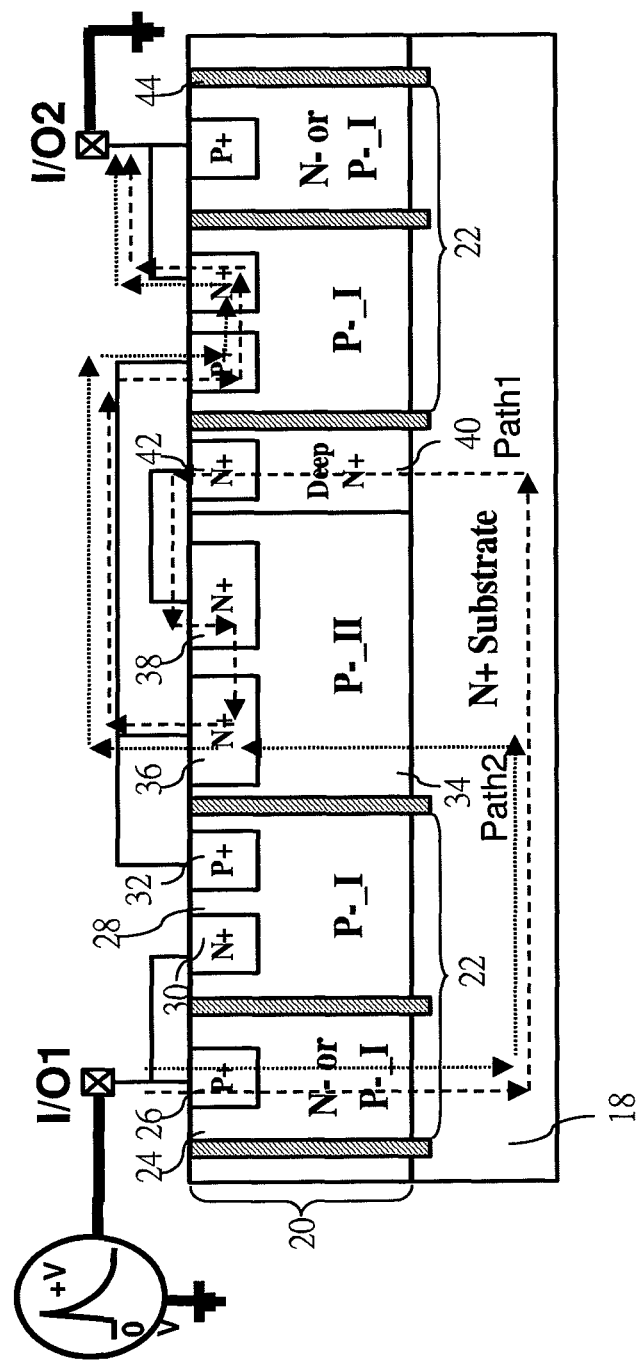
FIG. 7 is a sectional view schematically showing the transient voltage suppressor with ESD discharging paths according to the second embodiment of the present invention.

Refer to FIG. 7. The operation of the second embodiment is similar to that of the first embodiment. As a result, the breakdown region also occurs at the junction of the third N-type heavily doped area 38 and the second P-type lightly doped well 34. In other words, the breakdown voltage of lateral BJT can be easily adjusted to be smaller than that of vertical BJT. Therefore, the breakdown voltage of the present invention can be easily controlled as compared with that of prior art design. From FIG. 7, it is known that there are two ESD discharging paths in the second embodiment. When the first I/O pin I/O1 is under positive ESD stress and the second I/O pin I/O2 is grounded, the ESD current of path 1 is discharged through the first vertical diode to the lateral BJT, and then discharged through the second lateral diode to the grounded I/O pin. The ESD current of path 2 is discharged through the first vertical diode to the vertical BJT, and then discharged through the second lateral diode to the grounded I/O pin. With two ESD discharging paths in the present invention, the ESD protection efficiency of TVS can be improved within the limited layout area. And, the doping concentrations of first P-type lightly doped well 28 and the second P-type lightly doped well 34 can be different to achieve the requirements of low capacitance of I/O pin and low breakdown voltage of BJT structure at the same time.

It is noted the present invention can be extended to multi-channel application. When there are at least three steering diode structures 22, the first P-type heavily doped area 26 and the first N-type heavily doped area 30 of each steering diode structure 22 are connected with an I/O pin. Besides, if necessary, the second P-type heavily doped areas 32 and the second N-type heavily doped area 36 are connected with a grounded pin, and the N-type heavily doped substrate 18 is connected with a high voltage pin VDD. In other words, the connection of the grounded pin and the high voltage pin is optional.

In conclusion, the present invention changes the position of the breakdown region, whereby the doping concentrations of P-type lightly doped wells are independently controlled and the ESD protection efficiency is improved. Therefore, the suppressor of the present invention has the low input capacitance to benefit the signal performance and easily-controlled trigger voltage.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A low capacitance transient voltage suppressor, comprising:
    an N-type heavily doped substrate;
    an epitaxial layer formed on said N-type heavily doped substrate;
    at least one steering diode structure formed in said epitaxial layer, wherein said steering diode structure comprising:
        a diode lightly doped well formed in said epitaxial layer, wherein a first P-type heavily doped area is formed in said diode lightly doped well; and
        a first P-type lightly doped well formed in said epitaxial layer, wherein a first N-type heavily doped area and a second P-type heavily doped area are formed in said first P-type lightly doped well, and said first N-type heavily doped area is connected with said first P-type heavily doped area;
    a second P-type lightly doped well formed in said epitaxial layer, wherein a second N-type heavily doped area and a third N-type heavily doped area are formed in said second P-type lightly doped well, and said second N-type heavily doped area is connected with said second P-type heavily doped area; and
    an N-type heavily doped well formed in said epitaxial layer and connected with said third N-type heavily doped area; and
    at least one deep isolation trench formed in said epitaxial layer, having a depth greater than or equal to depths of all said doped wells, and separating at least one said doped well.

2. The low capacitance transient voltage suppressor according to claim 1, further comprising a fourth N-type heavily doped area, which is formed in said N-type heavily doped well and connected with said third N-type heavily doped area.

3. The low capacitance transient voltage suppressor according to claim 1, wherein said diode lightly doped well is an N-type diode lightly doped well or a P-type diode lightly doped well.

4. The low capacitance transient voltage suppressor according to claim 1, wherein said diode lightly doped well, said first P-type lightly doped well, said second P-type lightly doped well, said N-type heavily doped well, and said deep isolation trench are horizontally formed in said epitaxial layer.

5. The low capacitance transient voltage suppressor according to claim 1, wherein doping concentrations of said first P-type lightly doped well and said second P-type lightly doped well are different.

6. The low capacitance transient voltage suppressor according to claim 1, wherein deep isolation trench further separates said diode lightly doped well, said first P-type lightly doped well, and said second P-type lightly doped well.

7. The low capacitance transient voltage suppressor according to claim 1, wherein said N-type heavily doped substrate is connected with an I/O pin; and said first P-type heavily doped area and said first N-type heavily doped area are jointly connected with a grounded pin.

8. The low capacitance transient voltage suppressor according to claim 1, wherein when there are two said steering diode structures, one said first P-type heavily doped area and one said first N-type heavily doped area are connected with a first I/O pin, and another said first P-type heavily doped area and another said first N-type heavily doped area are connected with a second I/O pin.

9. The low capacitance transient voltage suppressor according to claim 8, wherein said second P-type heavily doped areas and said second N-type heavily doped area are connected with a grounded pin.

10. The low capacitance transient voltage suppressor according to claim 9, wherein said N-type heavily doped substrate is connected with a high voltage pin.

11. The low capacitance transient voltage suppressor according to claim 1, wherein when there are at least three said steering diode structures, said first P-type heavily doped area and said first N-type heavily doped area of each said steering diode structure are connected with an I/O pin.

12. The low capacitance transient voltage suppressor according to claim 11, wherein said second P-type heavily doped areas and said second N-type heavily doped area are connected with a grounded pin.

13. The low capacitance transient voltage suppressor according to claim 12, wherein said N-type heavily doped substrate is connected with a high voltage pin.

* * * * *